United States Patent [19]

Chen et al.

[11] Patent Number: 5,088,099
[45] Date of Patent: Feb. 11, 1992

[54] APPARATUS COMPRISING A LASER ADAPTED FOR EMISSION OF SINGLE MODE RADIATION HAVING LOW TRANSVERSE DIVERGENCE

[75] Inventors: Young-Kai Chen; Minghwei Hong, both of Berkeley Heights; Ming-Chiang Wu, Bridgewater, all of N.J.

[73] Assignee: AT&T Bell Laboratories, Murray Hill, N.J.

[21] Appl. No.: 631,292

[22] Filed: Dec. 20, 1990

[51] Int. Cl.⁵ .................................................. H01S 3/19
[52] U.S. Cl. .......................................... 372/45; 372/96
[58] Field of Search ..................................... 372/96, 45

[56] References Cited

U.S. PATENT DOCUMENTS 4,908,833  3/1990  Chraplyvy et al. ................... 372/96

FOREIGN PATENT DOCUMENTS

| 2131610 | 6/1984 | Japan | 372/45 |
| 0051283 | 3/1987 | Japan | 372/45 |
| 0070471 | 3/1988 | Japan | 372/45 |
| 0245984 | 10/1988 | Japan | 372/45 |
| 0170486 | 7/1990 | Japan | 372/45 |

OTHER PUBLICATIONS

"An 0.98-μm InGaAs Strained-Layer Quantum-Well Laser, an Efficient Plumping Source for $Er^3$-Doped Fiber Amplifiers", by S. Uehara et al., *Optoelectronics-Devices and Technologies*, vol. 5, No. 1, Jun. 1990, pp. 71-80.

"Efficient Power Coupling from a 980-nm, Broad-Area Laser to a Single-Mode Fiber Using a Wedge-Shaped Fiber Endface", by V. S. Shah et al., *Journal of Lightwave Technology*, vol. 8, No. 9, Sep. 1990, pp. 1313-1318.

"Single-Quantum-Well Laser with 11.2 Degree Transverse Beam Divergence", by Y. C. Chen et al., *Electronics Letters*, vol. 26, Aug. 16, 1990, pp. 1348-1350.

"Electromagnetic Propagation in Periodic Stratified Media, I. General Theory*", by P. Yeh et al., *J. Opt. Soc. Am.*, vol. 67, No 4, Apr. 1977, pp. 423-438.

"Optical Surface Waves in Periodic Layered Media[a])", by Y. Cho, *Applied Physics Letters*, 32(2), Jan. 15, 1978, pp. 104-105.

Primary Examiner—Georgia Epps
Attorney, Agent, or Firm—Eugen E. Pacher

[57] ABSTRACT

Disclosed is an edge-emitting semiconductor laser that has a single waveguiding structure, and that comprises means for reducing the transverse divergence of the far-field pattern of the laser emission. Typically these means comprise reflecting means (preferably transverse distributed Bragg reflectors) disposed parallel to the junction plane of the laser. Lasers according to the invention can have a highly stable single mode output having a substantially symmetrical far field pattern. Disclosed is also an advantageous method of making ridge-waveguide lasers that can, inter alia, be used to make lasers according to the invention. The method is a self-aligned method that does not comprise any critical alignment steps. Thus it is useful for making lasers that have a very narrow ridge waveguide. Such lasers are desirable because they can suppress lateral higher order modes.

9 Claims, 5 Drawing Sheets

APPARATUS COMPRISING A LASER ADAPTED FOR EMISSION OF SINGLE MODE RADIATION HAVING LOW TRANSVERSE DIVERGENCE

FIELD OF THE INVENTION

This invention pertains to edge-emitting semiconductor lasers, and to apparatus and systems that comprise such lasers.

BACKGROUND OF THE INVENTION

Edge-emitting semiconductor lasers are finding application in many areas of technology, from optical fiber communication systems to compact disc players to read/write optical data storage systems. In many of these applications it would be highly desirable if the cross section of the laser beam were substantially circular. For instance, it will be readily recognized that the attainable coupling efficiency between an edge-emitting laser and an optical fiber (especially a single mode fiber) would typically be much higher if the laser had a substantially symmetric far field pattern than it is if the laser has a highly asymmetric far field pattern. As is well known, conventional edge-emitting semiconductor lasers typically have a highly asymmetric far field pattern.

For instance, S. Uehara et al., *Optoelectronics*, Vol. 5, pp. 71-80 (1990) describe a 0.98 μm InGaAs strained-layer quantum well laser that is said to be an efficient pumping source for an Er-doped fiber amplifier. As disclosed on page 78 of that publication, the full width at half maximum (FWHM) of the far field pattern of the laser was 7° parallel to the junction of the laser but was 50° perpendicular to the junction, resulting in a coupling efficiency to single mode fiber of only about 20%.

V. S. Shah et al., *Journal of Lightwave Technology*, Vol. 8(9), pp. 1313-1318 (1990) disclose a technique for improving the coupling efficiency between a conventional laser (i.e., a laser having a highly elliptical far field pattern) and a single mode fiber. The technique involves providing a fiber with a wedge-shaped end face and, typically, an up-tapered end. Maximum attained coupling efficiency was 47%. Such a technique clearly would be difficult to implement outside of the laboratory, and in any case applies only to laser/fiber combinations.

Y. C. Chen et al., *Electronics Letters*, Vol. 26(17), pp. 1348-1350 (1990) (incorporated herein by reference), disclose a laser having a beam divergence in the direction perpendicular to the junction that is comparable to that parallel to the junction. The laser is a single quantum well laser that comprises four passive waveguides, the resulting structure having 5 eigenmodes, with the operating eigenmode said to be the one with the largest confinement factor with the gain medium. If such a laser is operated at high power levels it frequently will not only emit the fundamental mode but also higher order modes, again resulting in decreased coupling efficiency.

Decreased asymmetry of the far field pattern would not only make possible increased light collection efficiency but could, inter alia, also make it possible to relax the requirements of aberration correction. A relatively circular, low divergence-angle beam (e.g., 10° by 10°) also could greatly relax the misalignment tolerance for laser/fiber coupling.

In view of the advantages that could be realized if a single mode edge-emitting semiconductor laser with reduced asymmetry of the far field pattern were available, lasers that can be reliably single mode at all relevant power levels and that can have a substantially symmetric far field pattern would be of great interest. This application discloses such lasers.

SUMMARY OF THE INVENTION

In a first broad aspect the invention is an edge-emitting laser having a single waveguide structure and comprising means for reducing the far field transverse divergence of the emitted radiation, as compared to an otherwise identical laser that lacks said means. In currently preferred embodiments the means comprise reflector means (e.g., a transverse distributed Bragg reflector or TDBR, including a quasi-periodic TDBR) disposed essentially parallel to the junction of the laser. Typically the transverse far field divergence in devices according to the invention is at most twice the divergence in the plane of the junction, and preferably the two divergences are substantially equal and below about 20°. In a particular preferred embodiment that comprises periodic TDBRs the period $\Lambda$ associated with the TDBRs is selected such that $\Lambda = \lambda_g$, where $\lambda_g$ is the "guided" wavelength of the emitted radiation in the laser structure. More generally, $2\lambda_g > \Lambda \geq \lambda_g$.

In a second broad aspect the invention is a method of making a ridge-waveguide laser, exemplarily (but not limited to) a laser according to the invention. The method comprises providing a multilayer semiconductor body that comprises an "active" region and a major surface, processing the body such that a ridge-waveguide structure is formed and providing means for making electrical contact to the laser. Significantly, the "processing" step comprises forming a patterned first layer on the surface, and exposing the surface with the patterned first layer thereon to an etching medium such that the exposed portion of the surface is etched, the resulting "etched" surface overlying (and spaced apart from) the "active" region. It also comprises depositing a planarization layer such that the portion of the planarization layer that overlies the ridge-waveguide is thinner than the portion of the layer that overlies the etched surface, and further comprises removing the portion of the planarization layer that overlies the ridge-waveguide without removing all of the portion of the planarization layer that overlies the etched surface. Optionally a substantially conformal passivation layer (e.g., $SiO_2$) is deposited onto the surface after the etching step but before deposition of the passivation layer. The passivation layer exemplarily is polyimide.

The inventive method makes possible convenient manufacture of lasers having a relatively narrow (e.g., $\leq 5$ μm) ridge-waveguide, including such lasers that comprise TDBRs.

DETAILED DESCRIPTION OF PREFERRED EMBODIMENTS

Figure 1:
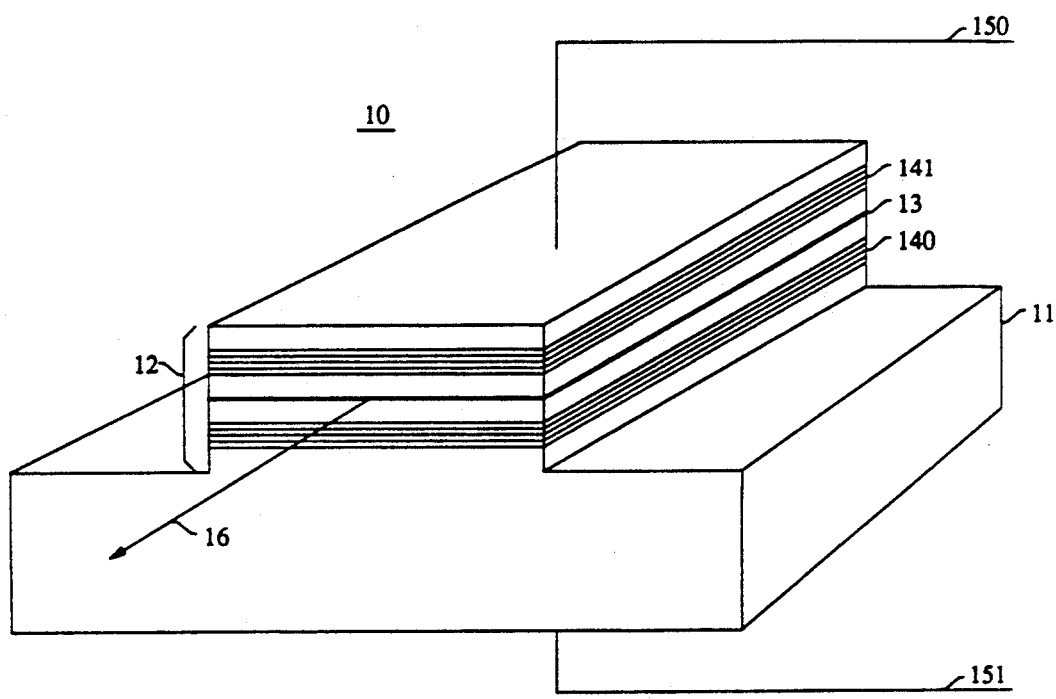
FIG. 1 schematically depicts an exemplary edge-emitting laser according to the invention.

FIG. 1 schematically depicts an exemplary laser 10 according to the invention. On substrate 11 (e.g., n+ GaAs) is formed multilayer structure 12 which comprises active region 13 (exemplarily comprising one or more quantum wells) and transverse distributed Bragg reflectors (TDBRs) 140 and 141. Means 150 and 151 for making electrical contact to the laser are also shown. Numeral 16 refers to the radiation emitted by the laser. It will be understood that, aside from a metalization layer (not shown) and possibly other auxiliary layers (also not shown), the multilayer structure 12 is a semiconductor heterostructure with substantially abrupt (and typically also some continuous) changes in composition. It will also be understood that TDBRs need not be periodic but can be quasi-periodic (e.g., "chirped"). Use of quasi-periodic TDBRs can make possible a reduction in reflector thickness while substantially retaining the ability to reduce the transverse beam divergence.

Figure 2:
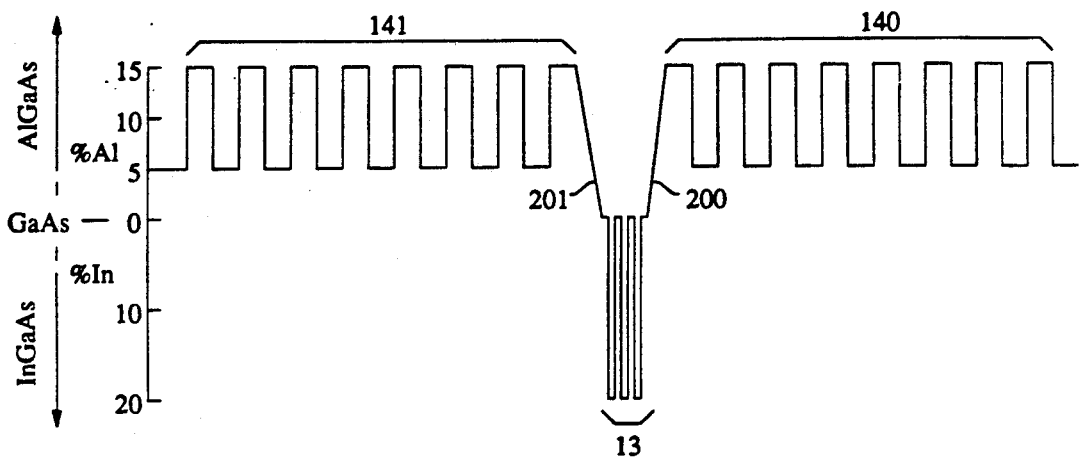
FIG. 2 schematically shows the conduction band edge of a relevant portion of an exemplary quantum well laser with transverse distributed Bragg reflectors (TDBRs)

FIG. 2 schematically depicts the conduction band edge of the relevant portion of the multilayer structure 12. The figure can also be understood to schematically depict the cross sectional compositional profile of the structure. Active region 13 consists of three 7 nm thick $In_{0.2}Ga_{0.8}As$ quantum wells and four GaAs barriers. Each TDBR (140, 141) consists of a multiplicity of semiconductor layers, exemplarily eight pairs of $Al_{0.15}Ga_{0.85}As/Al_{0.05}Ga_{0.95}As$ layers. Numerals 200 and 201 refer to graded index separate confinement layers. The spacing between the two TDBRs advantageously is adjusted to be about one period, exemplarily about 0.3 μm for a 0.98 μm laser.

The theoretical basis for the design of a TDBR structure that can be used in a laser according to the invention is known. See, for instance, P. Yeh et al., *Journal of the Optical Society of America*, Vol. 67(4), pp. 423–438 (1977); especially equation 59. See also P. Yeh et al., *Applied Physics Letters*, Vol. 32(2), pp. 104–105 (1978). Both of these references are incorporated herein by reference. Briefly, the structure is such that the transverse wavevector of the lasing mode ($k_x$) satisfies the condition $$k_x = \frac{\pi}{\Lambda},$$

where $\Lambda$ was defined above to be the period of the TDBR multilayers. This is similar to the well-known longitudinal round-trip phase condition for conventional λ/4-shifted distributed feedback (DFB) lasers. Just as the λ/4-shifted DFB laser uniquely selects a single longitudinal mode, a properly designed TDBR laser selects only the fundamental transverse mode and suppresses all the higher-order modes.

An important design parameter for lasers according to the invention is $\Lambda$, the repeat distance of the TDBR. Typically, $2\lambda_g > \Lambda \geq \lambda_g$, where $\lambda_g$ is the "guided" wavelength, i.e., the wavelength in the waveguide of the laser radiation. Since semiconductor lasers typically comprise relatively high-index materials, it will be appreciated that $\lambda_g$ typically is much shorter than the wavelength of the laser radiation in air.

By making $\Lambda < 2\lambda_g$, formation of a 2nd-order grating surface-emitting-laser coupled cavity is prevented. This eliminates the possibility of higher order transverse modes. On the other hand, no transverse resonance can occur for $\Lambda < \lambda_g$. It will be appreciated that, due inter alia to the wide range of possible $\lambda_g$, the design of a laser according to the invention typically requires an iterative approach and self-consistent determination of the laser parameters.

In a currently preferred embodiment of the invention $\Lambda = \lambda_g$. This results, in effect, in the formation of two coupled cavities, one associated with the longitudinal dimension of the waveguide and the other corresponding to that of a 2nd-order grating vertical cavity surface emitting laser (VCSEL). The existence of these "coupled cavities" results in particularly stable laser output (e.g., the lasing wavelength is less sensitive to temperature and/or output power variations), since generally only one of the many permitted longitudinal modes is both near the maximum of the gain spectrum and satisfies the 2nd order SEL roundtrip phase condition.

Figure 3:
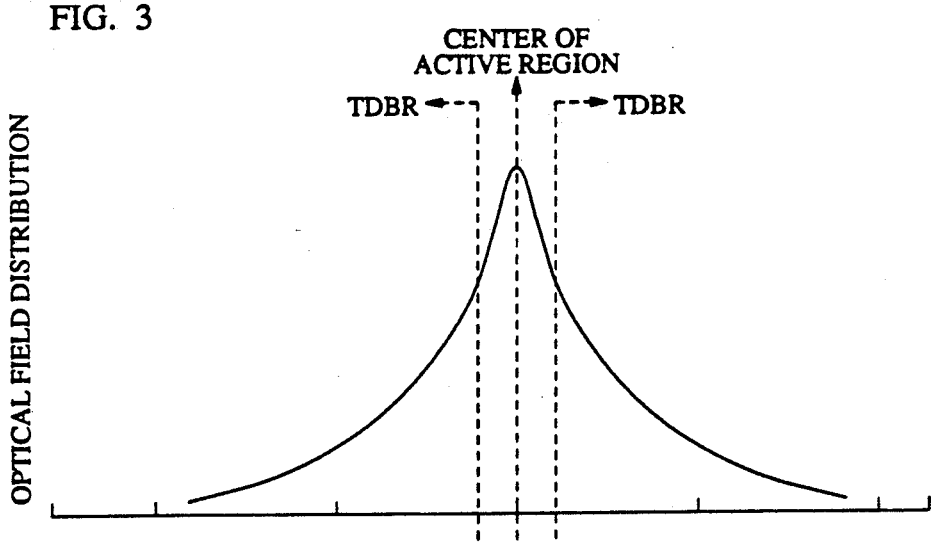
FIG. 3 shows the transverse field distribution in an exemplary laser according to the invention.

The transverse optical field distribution in a laser having the layer structure of FIG. 2 is shown in FIG. 3, which indicates the corresponding position of the center of the active region of the laser as well as the TDBR positions. As can be seen, a substantial portion of the total optical field extends into the TDBRs. The evanescent decay of the optical intensity in the TDBR, which determines the beam divergence, is readily controlled by the difference of the refractive indices ($\Delta n$) of the TDBR.

Figure 4:
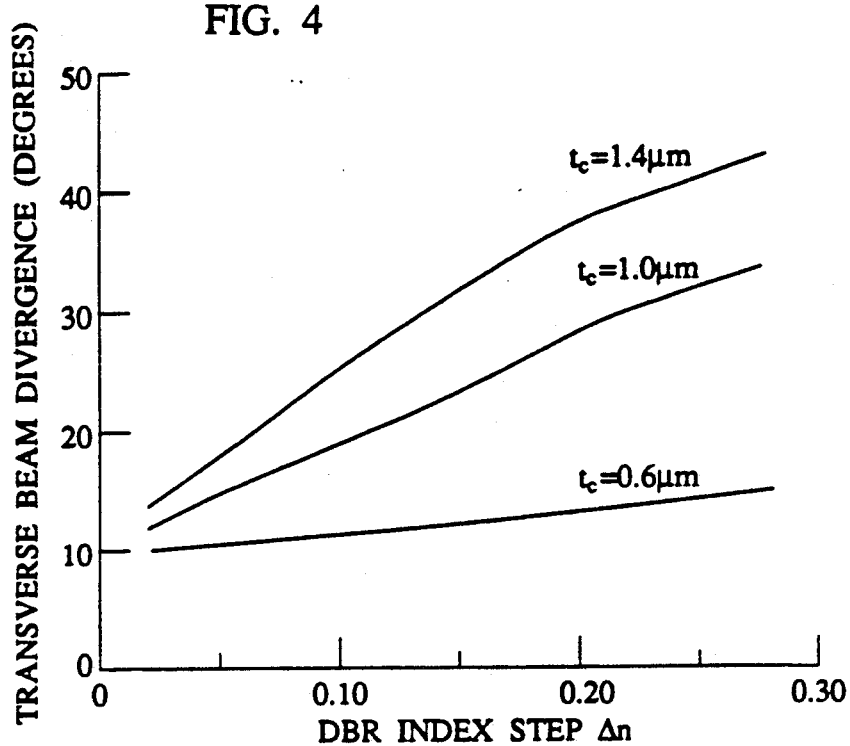
FIG. 4 gives curves of transverse beam divergence versus TDBR index step $\Delta n$ for an exemplary laser according to the invention.

FIG. 4 shows the calculated transverse beam divergence versus $\Delta n$ for three different spacings ($t_c$) between the TDBRs. By choosing the proper $t_c$ and $\Delta n$, the transverse beam divergence can be matched to the lateral divergence for, e.g., optimal coupling into single mode fiber, or to achieve minimum focused spot size. Experimental data agrees well with the theoretical results. The calculation was based on known theory as contained, for instance, in the above referred-to Yeh et al. papers.

Figure 5:
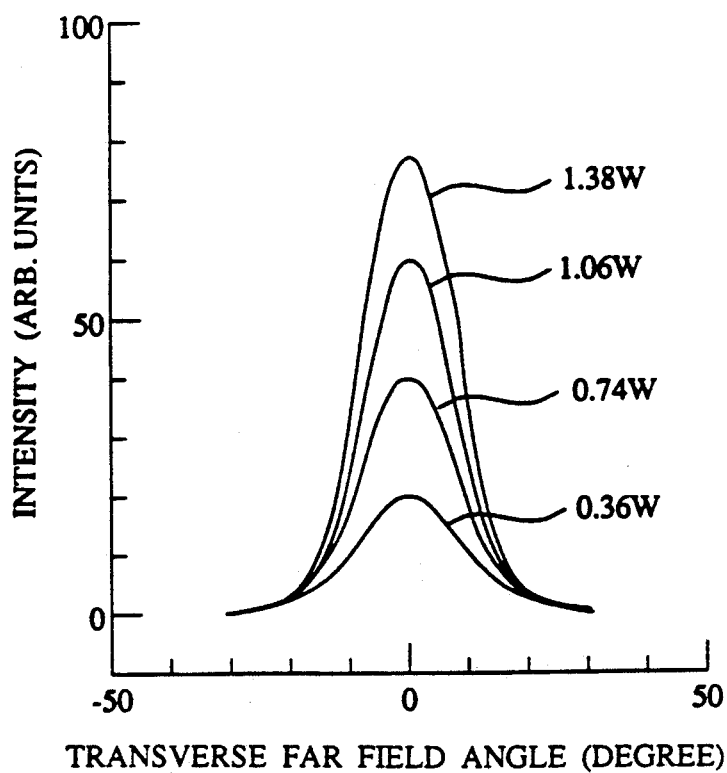
FIG. 5 shows curves of radiation intensity versus transverse far field pattern for an exemplary laser according to the invention.

FIG. 5 shows the observed transverse far field pattern for various output powers of a broad-area TDBR laser (50 μm width) according to the invention. Extremely stable transverse far field patterns were observed for output powers from 0–1.38 W (per facet) without any change of the beam shape. The observed transverse (i.e., perpendicular to the plane of the junction) far field pattern and FWHM angle of 15.6° agree closely with the predictions of the theory.

Lasers according to the invention can be produced by known techniques. Exemplarily, on a n+ GaAs substrate were deposited by MBE in sequence the following layers: a 500 nm n+ GaAs buffer layer; 8 pairs of $Al_{0.15}Ga_{0.85}As/Al_{0.05}Ga_{0.95}As$ layers, each of the layers being 150 nm thick, n-doped to $5 \times 10^{18}$ cm$^{-3}$; a 100 nm thick $Al_{0.15}Ga_{0.85}As$ layer, n-doped to $5 \times 10^{18}$ cm$^{-3}$; a 164 nm thick $Al_xGa_{1-x}As$ layer (x linearly decreasing from 0.15 to 0), n-doped to $5 \times 10^{18}$ cm$^{-3}$; a 10 nm GaAs layer, n-doped to $3 \times 10^{17}$ cm$^{-3}$; three 7 nm thick $In_{0.2}Ga_{0.8}As$ layers (not intentionally doped) separated by 12 nm thick GaAs layers (not intentionally doped); a 10 nm GaAs layer p-doped to $3 \times 10^{17}$ cm$^{-3}$; a 164 nm $Al_xGa_{1-x}As$ layer (x linearly increasing from 0 to 0.15), p-doped to $5\times10^{18}$ cm$^{-3}$; a 100 nm Al$_{0.15}$Ga$_{0.85}$As layer, p-doped to $5\times10^{18}$ cm$^{-3}$; 8 pairs of Al$_{0.15}$Ga$_{0.85}$As/Al$_{0.05}$Ga$_{0.95}$As layers, each of the layers being 150 nm thick, p-doped to $5\times10^{18}$ cm$^{-3}$; and a p++ 150 nm GaAs cap layer. The resulting multilayer structure was processed by conventional means (including lithography, wet etching, metallization, cleaving) into individual lasers.

Lasers according to the invention can be made by conventional techniques. However, they can also be made by a novel method that will be described below. The novel method is not limited to making lasers according to the invention but can be used generally to make edge emitting ridge-waveguide GRIN-SCH quantum well lasers.

Figure 6:
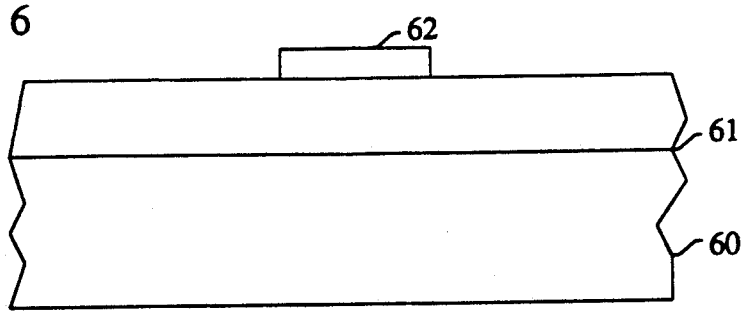
FIGS. 6–11 schematically depict stages in the inventive method of making a ridge-waveguide laser.

The method involves making the desired multilayer structure by any appropriate technique (including MBE, MOCVD, CBE, GSMBE, MOMBE, LPE and VPE). The top layer exemplarily is a p+ capping layer. On the top layer is formed a masking layer, and the masking layer is patterned so that a strip of masking material overlies the intended ridge waveguide portion of the multilayer structure. This is schematically depicted in FIG. 6, wherein numeral 60 refers to the multilayer semiconductor structure (individual layers other than active region 61 are not shown), and 62 refers to the strip of masking material. The masking material can be an appropriate resist or an appropriate metal such as W or, preferably, ohmic contact metal such as AuBe/Ti/Au.

Figure 7:
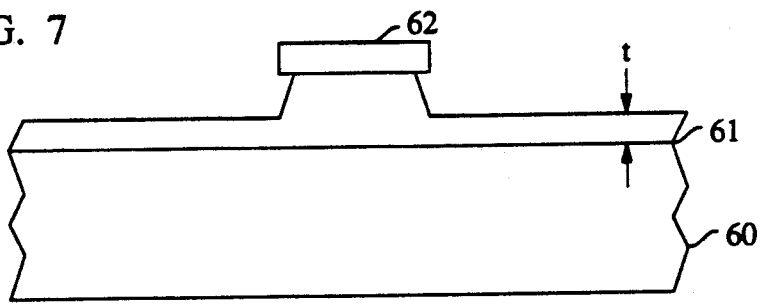

Next the multilayer structure is etched (wet or dry) to a depth such that the etched surface is a distance t (typically in the range 0.1–0.5 µm) from the active region as indicated in FIG. 7.

Figure 8:
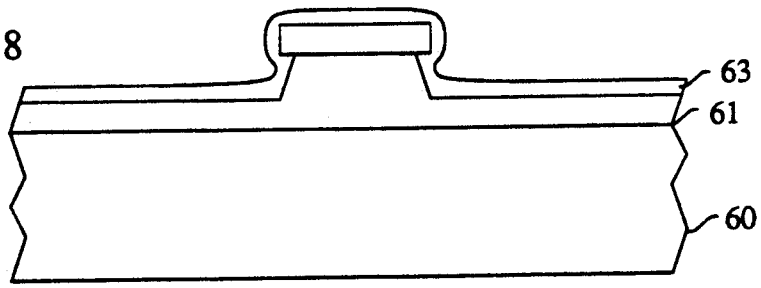

The etching step is preferably followed by deposition of a substantially conformal passivation layer, as shown schematically in FIG. 8, wherein 63 refers to the passivation layer. Exemplarily the passivation layer is CVD SiO$_2$.

Figure 9:
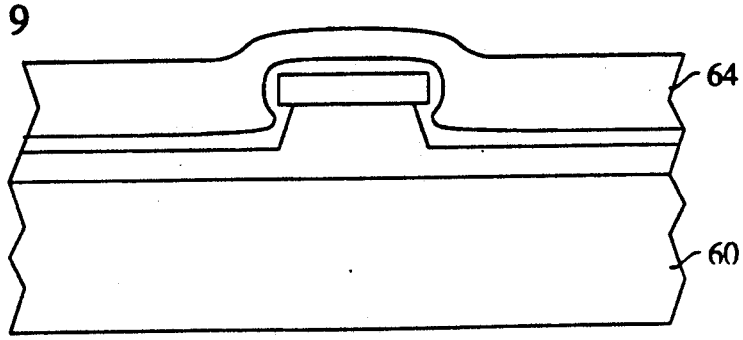

Deposition of the passivation layer is followed by a planarization step. As shown schematically in FIG. 9, the planarization material 64 (exemplarily polyimide) is substantially thinner where it overlies the ridge waveguide. This is a significant feature of the novel technique.

Figure 10:
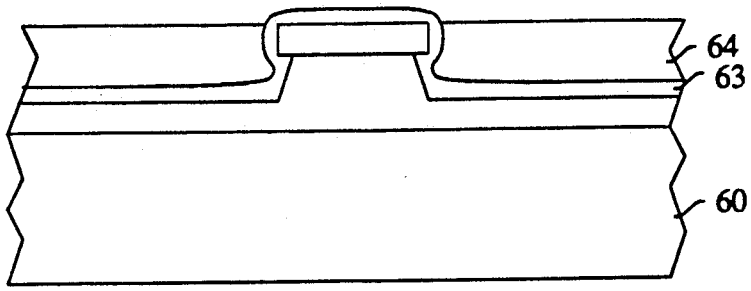
Figure 11:
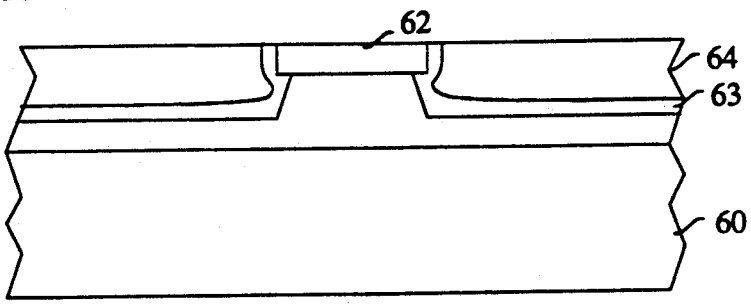

The optional passivation layer is then exposed by thinning of the planarization layer, exemplarily by reactive ion etching, using an oxygen plasma. The result is schematically shown in FIG. 10. This is followed by removal of the exposed portion of the passivation layer (e.g., by reactive ion etching using a CF$_4$ plasma), such that the masking strip is exposed (see FIG. 11).

If no passivation layer is used, then the planarization layer is thinned until the masking strip is exposed. If the masking strip is a resist strip then it is removed by a conventional technique, followed by deposition of contact metal (e.g., AuBe/Ti/Au if the top contact is the p contact). It will be noted that the metal can be deposited onto the whole wafer surface and does not require patterning. If the masking strip is a metal strip then it is not removed. Metal deposition onto all of the wafer surface is optional in this case.

The above described novel method is readily able to produce lasers having a very narrow ridge waveguide, since it is a self-aligned method and comprises no critical alignment steps. Narrow ridge waveguides are highly desirable because they can suppress lateral higher order modes.

Figure 12:
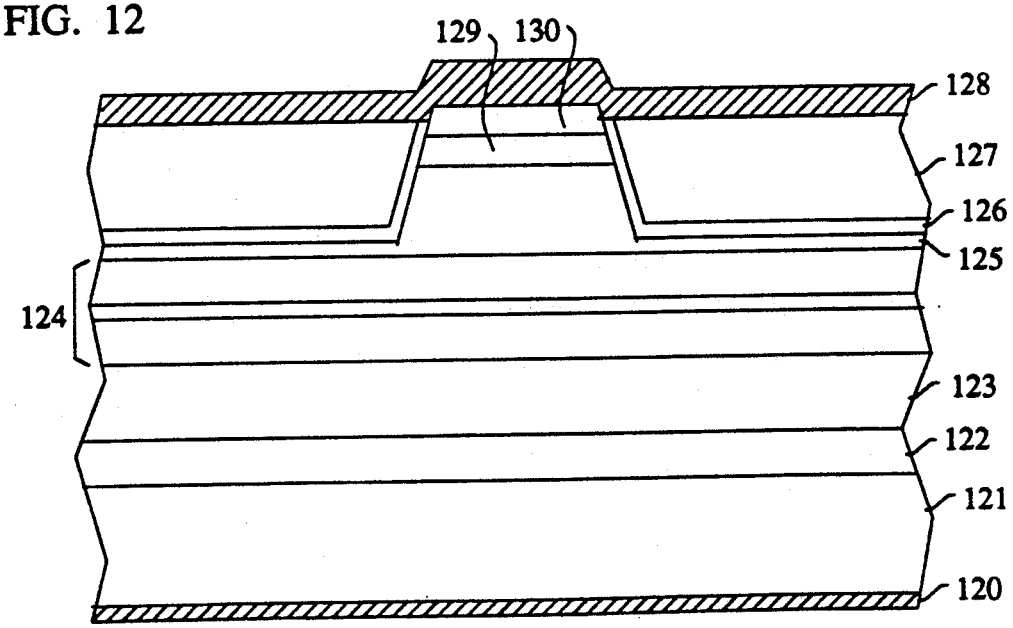
FIG. 12 schematically shows a ridge-waveguide laser made according to the inventive method.

FIG. 12 schematically depicts a laser produced according to the method, wherein 120 is a Au/Sn/Au ohmic metal contact layer, 121 is the n+ GaAs substrate, 122, the 500 nm n+ GaAs buffer layer, and 123 the 1 µm n+ Ga$_{0.6}$Al$_{0.4}$As cladding layer. Region 124 contains, in sequence, a 150 nm n-type Al$_x$Ga$_{1-x}$As (x varying linearly from 0.4 to 0) graded index confinement layer, three pairs of strained GaAs/In$_{0.2}$Ga$_{0.8}$As quantum wells that form the active region, and a 150 nm p-type Al$_x$Ga$_{1-x}$As graded index confinement region (x varying linearly from 0 to 0.4). The multilayer structure further contains 1 µm p+ Al$_{0.4}$Ga$_{0.6}$As cladding layer 125, SiO$_2$ passivation layer 126, polyimide layer 127, AuBe/Ti/Au p ohmic metal contact layer 128, p GaAs layer 129, and p+ GaAs cap layer 130.

Exemplarily, the laser of FIG. 12 was grown by OMVPE in an atmospheric-pressure vertical reactor on a misoriented [2° off (100) towards (110)] p+ GaAs substrate. Diethylzinc and diluted disilane in H$_2$ were used as the p- and n-type dopant precursors, respectively. The substrate temperature was 725° C. for the growth of the buffer, cladding, confining, and cap layers, and 625° C. for the growth of the multiple quantum wells. The growth rate was 1.8 µm/hour for GaAs and 3.0 µm/hour for AlGaAs. The 200 nm thick masking layer was SiO$_2$ and the width of the masking strips was 3 µm, oriented along [110]. The top layers were etched to within approximately 0.1 µm of the upper graded index layer, using a known H$_2$SO$_4$:H$_2$O$_2$:H$_2$O etch. The low viscosity polyimide (PC2-1500, obtained from the Futurex company of Newton, N.J., diluted with chlorobenzene) planarization layer was formed by a conventional spin-on and bake procedure. After reactive ion etching of the planarization layer in an oxygen plasma to expose the passivation layer overlying the ridge, the exposed SiO$_2$ passivation layer was etched in a conventional buffered HF solution. The contacts (which were evaporated after thinning the wafer to 100 µm) were alloyed at 450° C. for 10 seconds. Individual lasers were obtained by cleaving. The laser chips were then mounted junction-side-down on copper heat sinks. The lasers emitted at 0.98 µm, had a very low threshold current (exemplarily 3.5 mA), high differential quantum efficiency (e.g., 87%), high characteristic temperature (e.g., 220 K.) and large output power (e.g., 120 mW) with good far-field radiation patterns. Because of the low dielectric constant of polyimide it is also expected that the lasers have advantageous high frequency characteristics.

A TDBR ridge waveguide laser according to the invention can be produced substantially as described above, except that the process of forming the multilayer structure is modified such that region 124 of FIG. 12 is sandwiched between the TDBR structures. Such a laser can combine the above recited advantageous features with a substantially symmetric far field pattern, making possible, for instance, high coupling efficiency to optical fiber. (PC2-1500 obtained from the Futurex company of Newton, N.J., diluted with chloro-benzene).

We claim:

1. An edge-emitting semiconductor laser capable of emitting single mode radiation, associated with the laser is a junction, a longitudinal direction and, in a plane perpendicular to the longitudinal direction, a first direction that is perpendicular to the junction and a second direction that is parallel to the junction, and associated with the radiation is a far field pattern having a divergence in the first and the second direction, respectively;

the laser comprising a n-doped semiconductor region and a p-doped semiconductor region, means for making electrical contact to the p-doped and n-doped semiconductor regions, respectively, and reflecting means that form an optical cavity;

CHARACTERIZED IN THAT
- a) the laser comprises a single waveguiding structure, and furthermore comprises
- b) means for reducing the divergence of the far-field pattern in the first direction.

2. A laser according to claim 1, wherein the means of b) comprise reflector means disposed essentially parallel to the junction, and the divergence in the first direction is at most twice the divergence in the second direction.

3. A laser according to claim 2, wherein the reflector means comprise a distributed Bragg reflector that comprises a multiplicity of semiconductor layers comprising a first layer having a first refractive index and a second layer contacting the first layer and having a second refractive index that differs from the first refractive index.

4. A laser according to claim 3, wherein associated with the distributed Bragg reflector is a layer period $\Lambda$ selected such that $2\lambda_g > \Lambda \geq \lambda_g$, where $\lambda_g$ is the guided wavelength in the laser of the single mode radiation.

5. A laser according to claim 4, comprising two distributed Bragg reflectors that are essentially parallel to the longitudinal direction and one or more quantum wells disposed between the two distributed Bragg reflectors.

6. A laser according to claim 3, wherein the reflector is a quasi-periodic distributed Bragg reflector.

7. Apparatus comprising
- a) a semiconductor laser;
- b) means for causing a current to flow through the laser such that the laser emits electromagnetic radiation; and
- c) utilization means adapted for receiving at least a part of the radiation emitted by the laser, wherein the laser is an edge-emitting laser capable of emitting single mode radiation, associated with the laser is a junction, a longitudinal direction and, in a plane perpendicular to the longitudinal direction, a first direction that is perpendicular to the junction and a second direction that is parallel to the junction, and associated with the radiation is a far field pattern having a divergence in the first and the second direction, respectively; the laser comprising a n-doped semiconductor region and a p-doped semiconductor region, means for making electrical contact to the p-doped and n-doped semiconductor regions, respectively, reflecting means that form an optical cavity, a single waveguiding structure and means for reducing the divergence of the far-field pattern in the first direction.

8. Apparatus according to claim 7, wherein the apparatus is optical fiber communication apparatus, and the means of c) comprise an optical fiber.

9. Apparatus according to claim 7, wherein the apparatus is data processing apparatus, and the means of c) comprise optical data storage means.

* * * * *